United States Patent
Doneker et al.

(10) Patent No.: US 8,657,066 B2
(45) Date of Patent: Feb. 25, 2014

(54) NOISE DAMPENING ENERGY EFFICIENT ENCLOSURE, BULKHEAD AND BOOT MATERIAL

(75) Inventors: Robert L. Doneker, Portland, OR (US); Kent G. R. Thompson, Portland, OR (US)

(73) Assignee: Tangitek, LLC, Portland, OR (US)

( * ) Notice: Subject to any disclaimer, the term of this patent is extended or adjusted under 35 U.S.C. 154(b) by 186 days.

(21) Appl. No.: 13/172,729

(22) Filed: Jun. 29, 2011

(65) Prior Publication Data
US 2011/0253475 A1   Oct. 20, 2011

(51) Int. Cl.
*E04B 1/82* (2006.01)
*H02K 5/24* (2006.01)
*E04B 1/74* (2006.01)
*H02K 5/00* (2006.01)
*H05K 9/00* (2006.01)

(52) U.S. Cl.
USPC ........ 181/290; 181/294; 181/202; 174/105 R; 174/350

(58) Field of Classification Search
USPC ................ 181/290, 294, 284, 202, 200, 198; 174/105 R, 350, 565; 361/818, 816; 252/500
See application file for complete search history.

(56) References Cited

U.S. PATENT DOCUMENTS

| | | | |
|---|---|---|---|
| 4,684,020 A * | 8/1987 | Ohlbach | 206/721 |
| 4,703,134 A * | 10/1987 | Uematsu | 174/106 SC |
| 4,986,372 A * | 1/1991 | Ganssle | 174/106 SC |
| 5,010,209 A * | 4/1991 | Marciano-Agostinelli et al. | 174/23 C |
| 5,028,740 A | 7/1991 | Tomiya | |
| 5,043,538 A * | 8/1991 | Hughey, Jr. et al. | 174/107 |
| 5,170,010 A * | 12/1992 | Aldissi | 174/36 |
| 5,236,736 A * | 8/1993 | Kawakami et al. | 427/96.3 |
| 5,300,733 A * | 4/1994 | Uematsu | 174/106 SC |

(Continued)

FOREIGN PATENT DOCUMENTS

| | | |
|---|---|---|
| EP | 1612187 A1 | 1/2006 |
| JP | 06-021683 | 1/1994 |

(Continued)

OTHER PUBLICATIONS

Park, Ki-Yeon, et al., Application for MWNT-added Glass Fabric/Epoxy Composites to Electromagnetic Wave Shielding Enclosure, Department of Aerospace Engineering, Korea Advanced institute of Science and Technology, Composite Structures, v 81, n 3, 401-6, 2007; ISSN: 0263-8223; DOI: 10.1016/j.compstruct.2006.08.029; Publisher: Elsevier Science Ltd., UK.

*Primary Examiner* — Edgardo San Martin
(74) *Attorney, Agent, or Firm* — Marger Johnson & McCollom, PC (57) ABSTRACT

A noise dampening enclosure includes a first insulating layer, a second insulating layer, a carbon material layer disposed between the first and second insulating layers, a metal shield layer disposed between the first and second insulating layers, and a third insulating layer disposed between the carbon material layer and the metal shield layer. The carbon material layer can include resin-impregnated woven carbon fiber fabric. Strands of the carbon material can be orientated in various configurations, including layering the strands at different angles. Noise dampening bulkhead material provides additional shielding between circuit boards or other electronic components contained within the enclosure. In addition, a noise dampening boot can be placed over cable connections and assemblies to decrease the influences of unwanted electromagnetic noise.

18 Claims, 8 Drawing Sheets

(56) References Cited

U.S. PATENT DOCUMENTS

| | | | |
|---|---|---|---|
| 5,401,901 A | 3/1995 | Gerry et al. | |
| 5,486,648 A * | 1/1996 | Chan et al. | 174/23 R |
| 5,539,148 A | 7/1996 | Konishi et al. | |
| 6,215,070 B1 * | 4/2001 | King | 174/110 R |
| 6,384,337 B1 * | 5/2002 | Drum | 174/102 R |
| 6,526,860 B2 * | 3/2003 | Facciano et al. | 89/1.801 |
| 6,697,248 B1 * | 2/2004 | Luch | 361/220 |
| 6,786,771 B2 * | 9/2004 | Gailus | 439/607.01 |
| 6,825,411 B2 | 11/2004 | Pommerenke et al. | |
| 7,087,842 B2 * | 8/2006 | Belli et al. | 174/110 R |
| 7,276,664 B2 * | 10/2007 | Gagnon | 174/105 R |
| 7,738,942 B2 * | 6/2010 | Weiner et al. | 600/411 |
| 7,939,167 B2 | 5/2011 | Kim et al. | |
| 8,324,515 B2 * | 12/2012 | Stevenson et al. | 174/565 |
| 2005/0045358 A1 * | 3/2005 | Arnold | 174/51 |
| 2006/0083948 A1 | 4/2006 | Kawaguchi et al. | |
| 2007/0116916 A1 | 5/2007 | Ito et al. | |
| 2007/0293086 A1 | 12/2007 | Liu et al. | |
| 2009/0095523 A1 | 4/2009 | Stevenson et al. | |
| 2009/0104405 A1 | 4/2009 | Patten et al. | |
| 2009/0159328 A1 | 6/2009 | Dai et al. | |
| 2009/0287426 A1 * | 11/2009 | Kukowski | 702/35 |
| 2010/0086729 A1 * | 4/2010 | Long | 428/116 |
| 2010/0178487 A1 * | 7/2010 | Arai et al. | 428/300.1 |
| 2010/0188833 A1 | 7/2010 | Liang et al. | |
| 2010/0300744 A1 | 12/2010 | Romanko et al. | |
| 2011/0209909 A1 * | 9/2011 | Doneker et al. | 174/258 |
| 2011/0253441 A1 * | 10/2011 | Doneker et al. | 174/350 |
| 2011/0266023 A1 * | 11/2011 | Doneker et al. | 174/105 R |
| 2011/0309845 A1 * | 12/2011 | Kukowski | 324/617 |

FOREIGN PATENT DOCUMENTS

| | | |
|---|---|---|
| JP | 2004-095847 | 3/2004 |
| JP | 2005-285923 | 10/2005 |
| JP | 2009174956 | 8/2009 |
| JP | 2010062571 | 3/2010 |
| TW | 200929459 | 7/2009 |
| TW | 200929725 | 7/2009 |

* cited by examiner

NOISE DAMPENING ENERGY EFFICIENT ENCLOSURE, BULKHEAD AND BOOT MATERIAL

TECHNICAL FIELD

This disclosure relates to electromagnetic noise dampening materials, and, more particularly, to noise dampening energy efficient enclosures, bulkhead, and boot material.

BACKGROUND

Electromagnetic noise can cause unwanted interference with electrical and electronic systems. The quality and reliability of signals transmitted within or around such systems can be severely impacted, even to the point of causing inaccurate information. Such inaccuracies can result in mere annoyances on one end of the spectrum, such as television signal corruption or disconnected cell phone calls, but can also result in severe consequences on the other end of the spectrum, such as compromised airplane control systems, failed life support systems, or the like.

Moreover, government agencies such as the Federal Communications Commission (FCC), among other private and public bodies, require adherence to exacting standards for the emission of electromagnetic radiation. Much effort is expended in complying with the various laws and rules governing such emissions. Compliance through testing, redesigns, certifications, and the like, quite often requires the devotion of significant resources and time by product developers.

Electronics are often housed in some kind of enclosure. Efforts to improve the shielding characteristics of the enclosures from leaking unwanted electromagnetic noise into the surrounding area have improved over the years. Nevertheless, even today, significant cost and engineering go into the effort, generally followed by grueling test and verification procedures, which are then followed by corrective redesigns so that government standards or other minimum criteria are satisfied.

One of the primary aims of developers is to reduce or prevent electromagnetic radiation or waves from escaping the enclosure so that electronic systems nearby are not affected. In some cases, it is desirable to reduce or prevent electromagnetic radiation or waves from penetrating the enclosure, particularly in the case of test chambers, test equipment, or the like.

Within an enclosure, electromagnetic noise from one component can impact the operation of other components that are situated nearby. Wires or cables connected to the enclosure can themselves conduct noise into the enclosure, or vice versa. Conventional efforts to address the consequences of unwanted electromagnetic noise unfortunately can lead to less efficient designs. For instance, the energy efficiency of the system can become a concern because one approach for overcoming unwanted electromagnetic interference is to boost the power of the signals themselves to compensate for the noise, which inevitably leads to wasted energy resources, negative impacts to the economy, and the environment.

Accordingly, a need remains for improved noise dampening energy efficient enclosures, bulkhead, boots, and associated materials for reducing unwanted electromagnetic interference. In addition, a need remains for improving the power and energy efficiencies of electrical and electronic systems by shielding unwanted electromagnetic noise, thereby providing the ability to operate such systems more efficiently. Embodiments of the invention address these and other limitations in the prior art.

The foregoing and other features of the invention will become more readily apparent from the following detailed description, which proceeds with reference to the accompanying drawings.

DETAILED DESCRIPTION

Embodiments of the invention include a noise dampening energy efficient enclosure, bulkhead, boot, and associated materials. The terms "electromagnetic noise" or "interference" as used herein generally refer to unwanted electromagnetic waves or signals having the potential to disrupt the operation of electronic equipment or other devices. It should be understood, however, that the embodiments disclosed herein can provide beneficial electromagnetic wave dampening for any type of electromagnetic signal, whether or not it is considered "noise" per se, and whether or not actual disruption is caused, and therefore, such terms should be construed broadly.

Figure 1A:
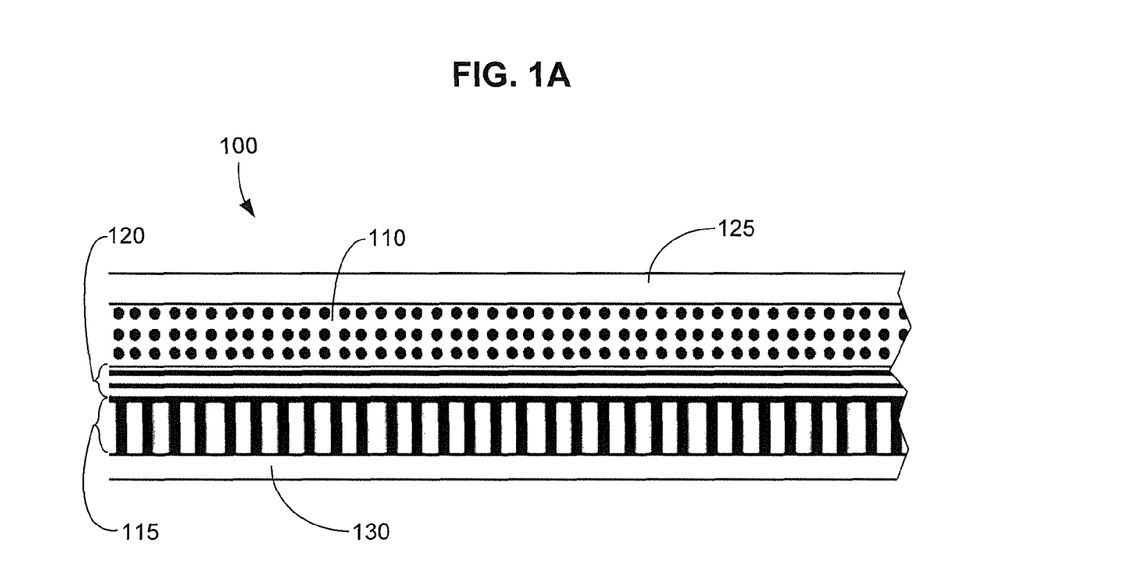
FIG. 1A illustrates a cross sectional view of noise dampening energy efficient material, including electromagnetic absorbing carbon elements, for use as enclosure material according to one example embodiment of the present invention.

FIG. 1A illustrates a cross sectional view of noise dampening energy efficient material 100, including electromagnetic absorbing carbon elements, for use as enclosure material according to one example embodiment of the present invention. The noise dampening material 100 can be used, for example, in an enclosure, or other similar structure, for shielding, reducing, and/or containing unwanted electromagnetic interference.

The noise dampening material 100 can include a first insulating layer 125, a second insulating layer 130, and a carbon material layer 110 disposed between the first and second insulating layers 125/130. Other layers of similar or different materials can also be disposed between the first and second insulating layers 125/130, in various arrangements, as further described below.

The first insulating layer 125 can be adjacent to and in contact with the carbon material layer 110, and when used with an enclosure, the first insulating layer 125 can function as an inner insulating layer. The second insulating layer 130 can be adjacent to and in contact with a metal shield layer 115, and when used with an enclosure, the second insulating layer 130 can function as an outer insulating layer. A third insulating layer 120 is disposed between the carbon material layer 110 and the metal shield layer 115. More specifically, the third insulating layer 120 is adjacent to and in contact with the carbon material layer 110 and the metal shield layer 115. The positioning of the carbon material layer 110 relative to the metal shield layer 115, as separated by the third insulating layer 120, creates an electromagnetic dampening zone, which reduces or eliminates electromagnetic noise, as further explained below.

The first, second, and/or third insulating layers can include a dielectric material. For example, the insulating layers can include a glass fiber material, which can be, for example, up to one (1) millimeter in thickness. The metal shield layer 115 is preferably copper (Cu), but can include any suitable conductor including gold (Au), silver (Ag), and so forth.

The carbon material layer 110 is preferably up to one (1) millimeter in thickness, although thicker layers can be used. In some embodiments, the carbon material layer 110 can include resin-impregnated woven carbon fiber fabric. In a preferred embodiment, the resin-impregnated carbon material has a specific resistance no greater than 100 $\Omega/cm^2$. In some embodiments, the carbon material layer 110 includes carbon nanotube material.

The carbon material layer 110 can include strands of carbon fiber. The strands of fiber can be formed in at least two layers, one layer having strands orientated 90 degrees relative to another layer. Multiple layers of strands can be situated as such, each layer orientated 90 degrees relative to an adjacent layer. Such layering improves the noise dampening qualities of the carbon layer material.

Alternatively, the strands of carbon fiber can be included in at least three layers, each layer orientated 60 degrees relative to another adjacent layer. For example, a first layer can have strands orientated 60 degrees relative to a second layer, and the second layer can have strands orientated at 60 degrees relative to a third layer, and so on. In some embodiments, N number of layers of carbon fiber can be used, in which the carbon fiber strands of each layer are orientated at one of $X_1$, $X_2$, ... $X_N$ degrees relative to the carbon strands of a different adjacent layer, wherein the sum of $X_1, X_2, ... X_N$ is 180.

Figure 1B:
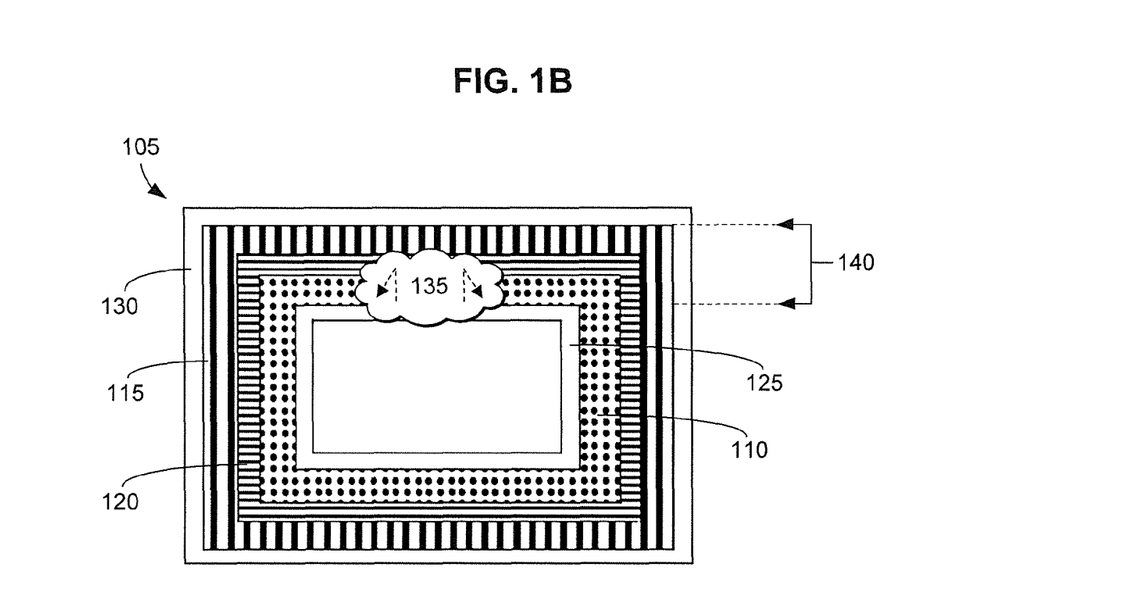
FIG. 1B illustrates a plan view of an enclosure incorporating the noise dampening material of FIG. 1A according to an example embodiment.
Figure 1C:
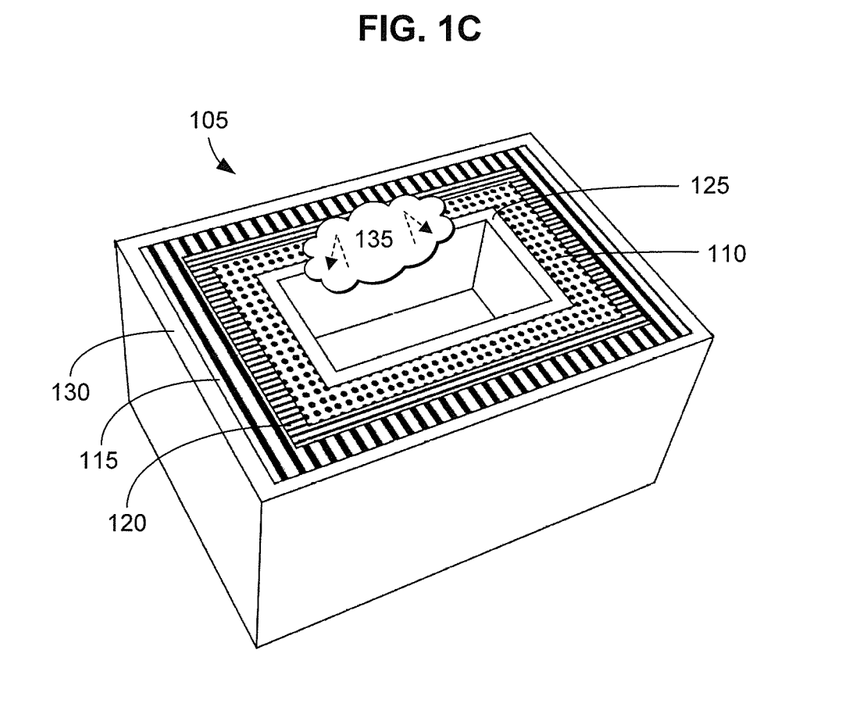
FIG. 1C illustrates a perspective view of the enclosure of FIG. 1B.

FIG. 1B illustrates a plan view of an enclosure 105 incorporating the noise dampening material 100 of FIG. 1A according to an example embodiment. FIG. 1C illustrates a perspective view of the enclosure 105 of FIG. 1B. Reference is now made to FIGS. 1B and 1C.

In some embodiments, the enclosure material 100 of FIG. 1A is used to form an enclosure 105. Each wall of the enclosure can include the inner insulating layer 125 disposed inwardly of the enclosure 105 and the outer insulating layer 130 disposed outwardly of the enclosure 105, as shown in FIG. 1B. The carbon material layer 110 is adjacent to and in contact with the inner insulating layer 125, and the metal shield layer 115 is adjacent to and in contact with the outer insulating layer 130. In some embodiments, the fiber strands of the carbon material layer 110 run in the same or similar plane of a wall of the enclosure 105.

The metal shield layer 115, the third insulating layer 120, and the carbon material layer 110 form an electromagnetic dampening zone (e.g., 140) in which the carbon material layer 110 enhances the shielding characteristics of the metal shield layer 115. Thus, the walls of the enclosure 105 are structured to prevent or reduce electromagnetic noise 135 from escaping the enclosure 105. While the enclosure of FIG. 1C shows a side having an opening, it should be understood that the enclosure can include noise dampening walls on all sides, thereby completing the enclosure. It should also be understood that an enclosure incorporating these noise dampening elements can have fewer walls than shown, and indeed, can be of any suitable shape including spherical, cylindrical, rectangular, or the like.

Figure 2A:
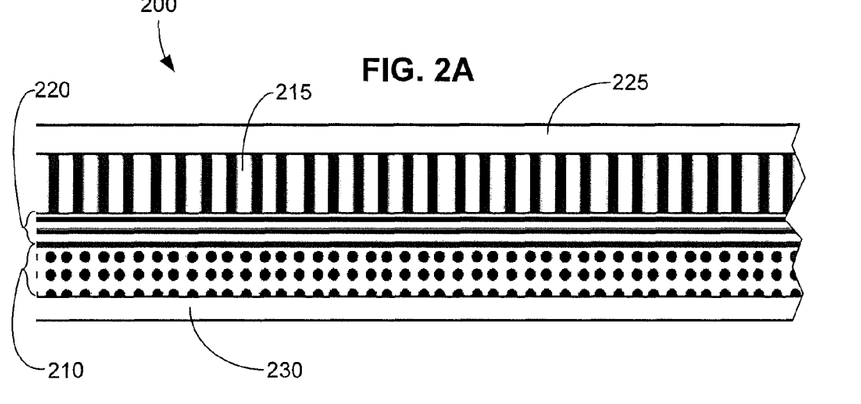
FIG. 2A illustrates a cross sectional view of noise dampening energy efficient material, including electromagnetic absorbing carbon elements, for use as enclosure material according to another example embodiment of the present invention.

FIG. 2A illustrates a cross sectional view of noise dampening energy efficient material 200, including electromagnetic absorbing carbon elements, for use as enclosure material according to another example embodiment of the present invention. The noise dampening material 200 can be used, for example, in an enclosure, or other similar structure, for shielding, reducing, and/or repelling unwanted electromagnetic interference.

The noise dampening material 200 can include a first insulating layer 225, a second insulating layer 230, and a carbon material layer 210 disposed between the first and second insulating layers 225/230. Other layers of similar or different materials can also be disposed between the first and second insulating layers 225/230, in various arrangements, as further described below.

The first insulating layer 225 can be adjacent to and in contact with the metal shield layer 215, and when used with an enclosure, the first insulating layer 225 can function as an inner insulating layer. The second insulating layer 230 can be adjacent to and in contact with a carbon material layer 210, and when used with an enclosure, the second insulating layer 230 can function as an outer insulating layer. A third insulating layer 220 is disposed between the carbon material layer 210 and the metal shield layer 215. More specifically, the third insulating layer 220 is adjacent to and in contact with the carbon material layer 210 and the metal shield layer 215. The positioning of the carbon material layer 210 relative to the metal shield layer 215, as separated by the third insulating layer 220, creates an electromagnetic dampening zone, which reduces or eliminates electromagnetic noise, as further explained below.

The first, second, and/or third insulating layers can include a dielectric layer. For example, the insulating layers can include a glass fiber material, which can be, for example, up to one (1) millimeter in thickness. The metal shield layer 215 is preferably copper (Cu), but can include any suitable conductor including gold (Au), silver (Ag), and so forth. The properties of the carbon material layer 210 are similar to or the same as the properties of the carbon material layer 110 discussed above, and for the sake of brevity, the detailed description of these properties are not repeated. Moreover, the different layering techniques of carbon strands, and so forth, as described above, can also be embodied in the carbon material layer 210.

Figure 2B:
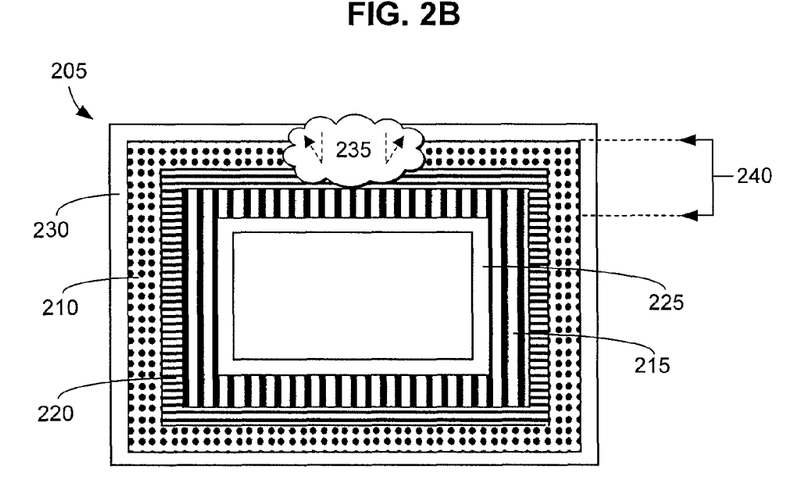
FIG. 2B illustrates a plan view of an enclosure incorporating the noise dampening material of FIG. 2A according to an example embodiment.
Figure 2C:
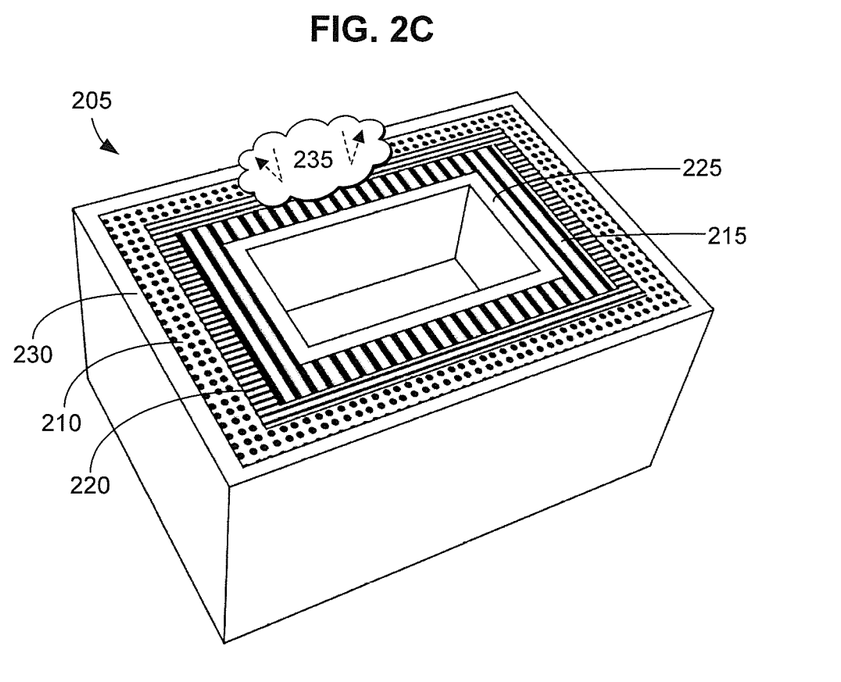
FIG. 2C illustrates a perspective view of the enclosure of FIG. 2B.

FIG. 2B illustrates a plan view of an enclosure 205 incorporating the noise dampening material 200 of FIG. 2A according to an example embodiment. FIG. 2C illustrates a perspective view of the enclosure 205 of FIG. 2B. Reference is now made to FIGS. 2B and 2C.

In some embodiments, the enclosure material 200 of FIG. 2A is used to form an enclosure 205. Each wall of the enclosure can include the inner insulating layer 225 disposed inwardly of the enclosure 205 and the outer insulating layer 230 disposed outwardly of the enclosure 205, as shown in FIG. 2B. The carbon material layer 210 is adjacent to and in contact with the outer insulating layer 230, and the metal shield layer 215 is adjacent to and in contact with the inner insulating layer 225. In some embodiments, the fiber strands of the carbon material layer 210 run in the same or similar plane of a wall of the enclosure 205.

The metal shield layer 215, the third insulating layer 220, and the carbon material layer 210 form an electromagnetic dampening zone (e.g., 240) in which the carbon material layer 210 enhances the shielding characteristics of the metal shield layer 215. Thus, the walls of the enclosure 205 are structured to prevent or reduce electromagnetic noise 235 from entering the enclosure 105. While the enclosure of FIG. 2C shows a side having an opening, it should be understood that the enclosure can include noise dampening walls on all sides, thereby completing the enclosure. It should also be understood that an enclosure incorporating these noise dampening elements can have fewer walls than shown, and indeed, can be of any suitable shape including spherical, cylindrical, rectangular, or the like.

While enclosures 105 and 205 include noise dampening materials for containing and repelling unwanted electromagnetic interference, respectively, it should be understood that the noise dampening materials 100 and 200 can be layered or otherwise combined to form a material that both contains and repels unwanted electromagnetic interference, and which can be incorporated into the walls of an enclosure such as 105 and/or 205.

It should be understood that the components, materials, and layers illustrated in FIGS. 1A-1C and 2A-2C are not necessarily drawn to scale. It should also be understood that the various layers of materials shown and described can be incorporated or combined with other materials to form the walls of the enclosure 105 and/or 205. In some embodiments, the materials and layers described herein can be applied to walls of Faraday cages, to further reduce electromagnetic noise. In some embodiments, the materials and layers described herein can be applied to the walls of a room and/or a building.

Figure 3:
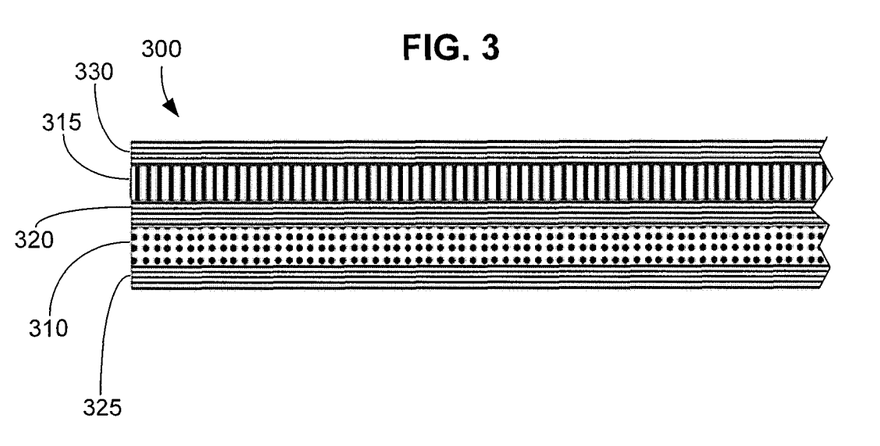
FIG. 3 illustrates a cross sectional view of noise dampening energy efficient bulkhead material according to still another example embodiment of the present invention.

FIG. 3 illustrates a cross sectional view of noise dampening energy efficient bulkhead material 300 according to still another example embodiment of the present invention. The bulkhead material 300 can include a carbon material layer 310, a metal shield layer 315, a first insulating layer 320 disposed between the carbon material layer 310 and the metal shield layer 315, and a second insulating layer 325 disposed on a surface of the carbon material layer 310 opposite the first insulating layer 320. In addition, an optional third insulating layer 330 can be disposed on a surface of the metal shield layer 315 opposite the first insulating layer 320.

The first, second, and third insulating layers can include a dielectric material. For example, the insulating layers can include a glass fiber material, which can be, for example, up to one (1) millimeter in thickness. The metal shield layer 315 is preferably copper (Cu), but can include any suitable conductor including gold (Au), silver (Ag), and so forth. The carbon material layer 310 can have the same or similar composition and characteristics as those described above.

Figure 4:
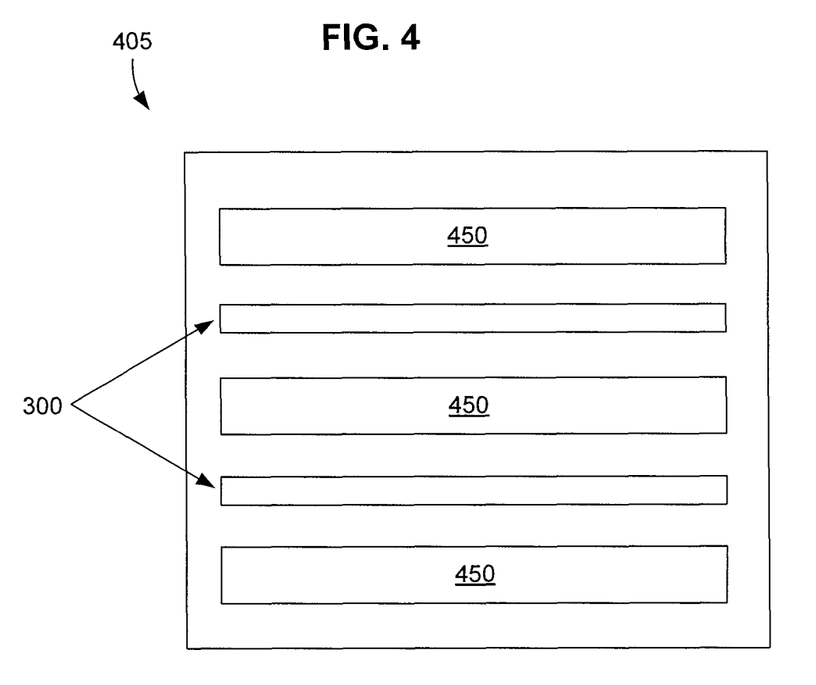
FIG. 4 illustrates a block diagram including an application of the bulkhead material of FIG. 3.

FIG. 4 illustrates a block diagram including an application of individual bulkhead material 300 sections of FIG. 3, variously arranged between different circuit boards 450. The bulkhead material 300 dampens cross-talk or other electromagnetic noise that can otherwise be transmitted between circuit components, circuit boards, conductors, or the like, within a system or enclosure 405. Applying insulation to both sides protects the bulkhead material from the accidental grounding of surface components situated on adjacent circuit boards.

Moreover, the carbon material layer 310, the metal shield layer 315, the first insulating layer 320, and the second insulating layer 325, and the optional third insulating layer 330 form an electromagnetic noise dampening bulkhead 300 disposed between circuit boards 450, and/or between other components contained within the enclosure 405, for reducing the transmission of electromagnetic noise between circuit boards 450. The bulkhead 300 can be used between circuit board layers within enclosures or circuit board layers to decrease the unwanted electromagnetic cross-talk between circuit elements and assemblies.

Figure 5:
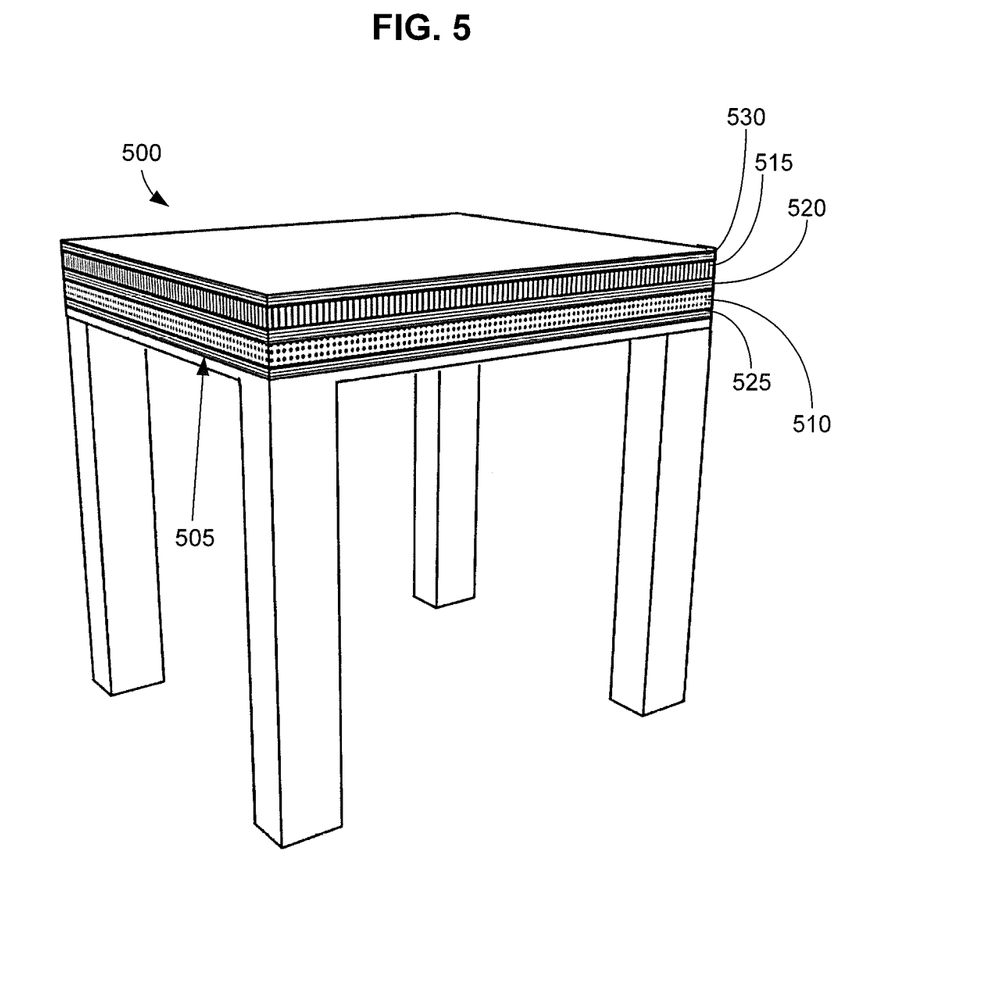
FIG. 5 illustrates a perspective view of a table including the noise dampening energy efficient materials disclosed herein.

FIG. 5 illustrates a perspective view of a table 500 including the noise dampening energy efficient materials disclosed herein. Layers similar to the bulkhead material 300 described with reference to FIG. 4 can be applied to a surface 505 of a table 500. This is particularly useful for shielding devices which themselves are under test, from the unwanted effects of electromagnetic interference. When devices themselves are tested for compliance with a particular standard, such as an FCC standard for bounded electromagnetic radiation emissions, the test environment ought to be as noise-free as possible.

More specifically, the surface 505 of the table can have disposed thereon a first insulating layer 525, a carbon material layer 510 atop the first insulating layer 525, a second insulating layer 520 atop the carbon material layer 510, a metal shield layer 515 atop the second insulating layer 520, and a third insulating layer 530 atop the metal shield layer 515. The composition and properties of the insulating layers, carbon material layer, and metal shield layer are the same as or similar to those described above.

Figures 6A, 6B, 6C:
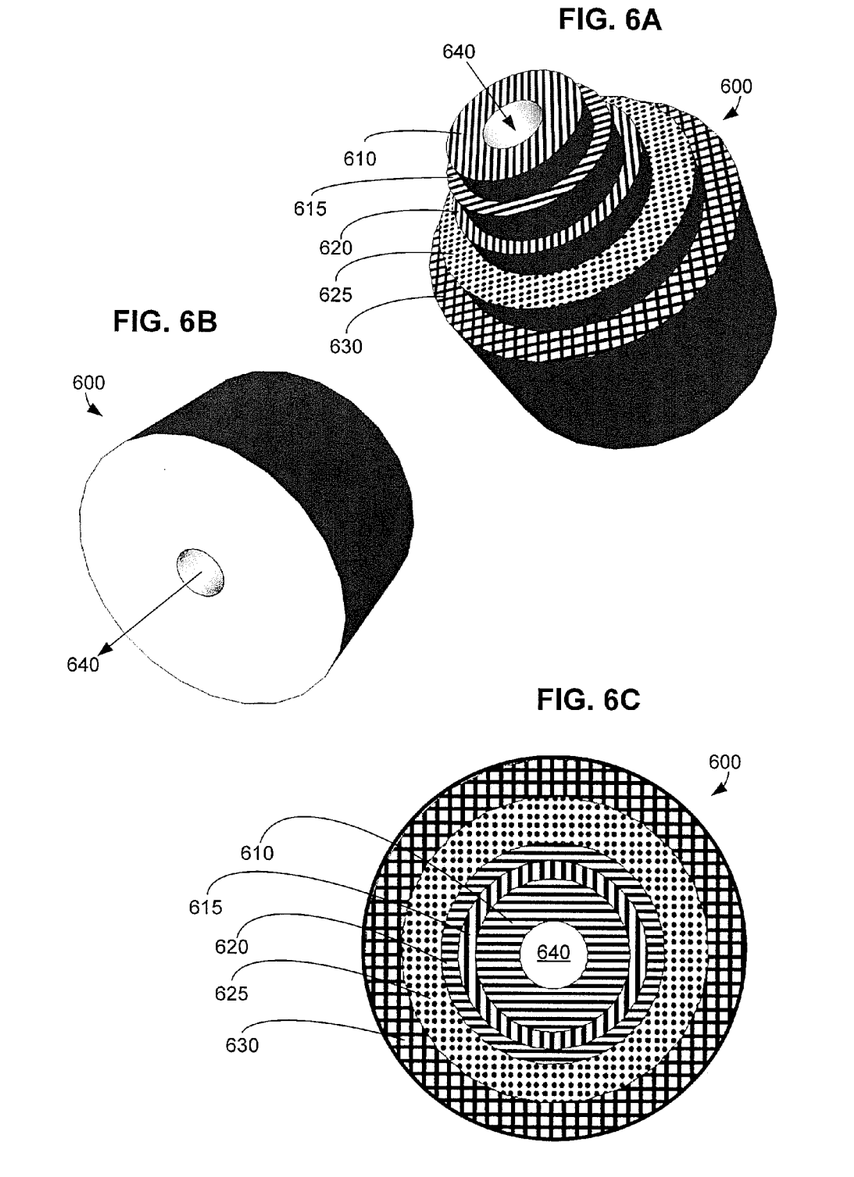
FIGS. 6A-6C illustrate perspective and plan views of a noise dampening energy efficient boot according to another example embodiment of the present invention.
Figure 7:
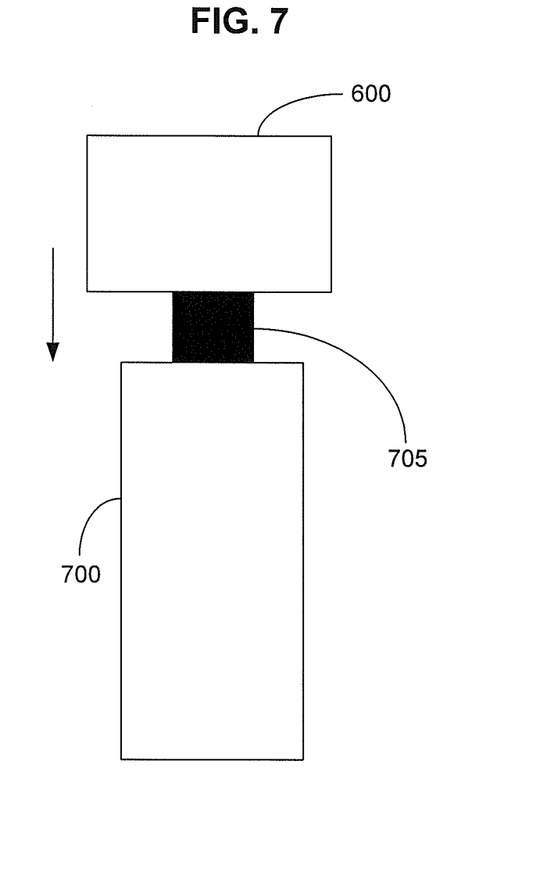
FIG. 7 illustrates a side elevation view of the noise dampening energy efficient boot of FIGS. 6A-6C.

FIGS. 6A-6C illustrate perspective and plan views of a noise dampening energy efficient boot 600 according to another example embodiment of the present invention. FIG. 7 illustrates a side elevation view of the noise dampening boot of FIGS. 6A-6C. Reference is now made to FIGS. 6A-6C and 7.

The noise dampening boot 600 includes an insulating inner section 610, a metal shield layer 615 surrounding the insulating inner section 110, an insulating layer 620 surrounding the metal shield layer 615, a carbon material layer 625 surrounding the insulating layer 620, and a protective sheath 630 wrapping the carbon material layer 625. The inner section 610 of the boot can include an opening 640 therein to receive the end of a conductor, cable, or the like. In other words, the boot 600 can be used to terminate or cap the end of a conductor, cable, wire, or the like, so that electromagnetic noise is contained. Put differently, the noise dampening boot 600 can be placed over cable connections and unmodified cable assemblies to decrease the influences of unwanted electromagnetic noise.

The carbon material layer 625 can include strands of carbon fiber running along a length of the boot 600, for example, in parallel relative to an axial direction of the insulating inner section 610. In some embodiments, substantially all of the fiber strands of the carbon material layer 625 are disposed in parallel relative to the axial direction of the insulating inner section 610.

Alternatively, the strands of carbon fiber may run circumferentially around the boot 600 relative to the insulating inner section 610. In yet another configuration, the multiple layers of strands of carbon fiber can be disposed one atop another, and/or woven, with each layer having the carbon strands orientated at a different angle respective to one another. For example, one layer of strands can be orientated at 90 degrees relative to another adjacent layer.

In some embodiments, the carbon material layer 625 includes a first layer having fiber strands orientated in a first direction at substantially 45 degrees relative to an axial direction of the inner section 610, and a second layer having fiber strands orientated in a second direction crossing the fiber strands of the first layer at substantially 45 degrees relative to the axial direction of the inner section 610.

In this manner, electrons can travel along certain paths or patterns in the carbon material layer, allowing the electromagnetic noise characteristics of the environment to be controlled. It should be understood that a weave pattern can include other forms or patterns depending on the qualities and noise characteristics of a particular conductor or cable with which the boot 600 is used.

The metal shield layer 615 can be a flexible conducting metal layer, including for example, copper (Cu), but can include any suitable conductor including gold (Au), silver (Ag), and so forth. The inner section 610 and insulating layer 620 are preferably glass fiber material, but any suitable dielectric insulating material can be used. The composition and properties of the carbon material layer 625 are similar to or the same as the properties of the carbon material layers described above.

It should be understood that while the perspective view of the boot 600 in FIG. 6A shows different layer protruding from the boot, the layers of the boot can be flush so that the boot 600 is formed in a substantially cylindrical embodiment. It should also be understood that the cross sectional shape of the boot 600 need not be cylindrical, but can be formed in other shapes such as rectangular, triangular, hexagonal, and so forth.

FIG. 7 illustrates a side elevation view of the noise dampening boot of FIGS. 6A-6C. The noise dampening boot 600 can be placed on the end of a conductor 705 and/or at the end of a cable, wire, cord (e.g., 700), or the like. In other words, the boot can be disposed on the end of a conductor 705 and/or cable 700, or the like. The conductor and/or cable, or the like, can pass partially or completely through the opening 640 of the boot 600.

In addition to the noise dampening features described herein, power and energy efficiencies are also improved. For instance, as the noise qualities of an enclosure and/or conductors are improved, the signal qualities also improve, and the nearby circuits can operate with lower voltages, use fewer parts, less power, and so forth. Battery operated circuit boards can draw less energy from the batteries, thereby extending the lifecycle of the battery, and reducing the amount of waste produced by discarded batteries and other components. Server farms use massive amounts of energy to operate multiple sensitive components, sometimes 24 hours per day, 365 days per year. In other words, the power consumption characteristics and energy efficiencies associated with these noise dampening materials are significantly improved, and can reduce the demands on the energy infrastructure.

Consequently, in view of the wide variety of permutations to the embodiments described herein, this detailed description and accompanying material is intended to be illustrative only, and should not be taken as limiting the scope of the invention.

What is claimed is:

1. A noise dampening enclosure material, comprising:
a first insulating layer;
a second insulating layer;
a carbon material layer disposed between the first and second insulating layers;
a metal shield layer disposed between the first and second insulating layers; and
a third insulating layer disposed between the carbon material layer and the metal shield layer;
wherein the carbon material layer is composed of a plurality of strands of resin-impregnated carbon fibers such that the carbon material layer is resistive to electromagnetic radiation.

2. The noise dampening enclosure material of claim 1, wherein the carbon material layer includes strands of carbon fiber.

3. The noise dampening enclosure material of claim 1, wherein the strands of carbon fiber are included in at least two layers, one layer having strands orientated 90 degrees relative to another layer.

4. The noise dampening enclosure material of claim 1, wherein the strands of carbon fiber are included in at least three layers, a first layer having strands orientated 60 degrees relative to a second layer, and the second layer having strands orientated at 60 degrees relative to a third layer.

5. The noise dampening enclosure material of claim 1, wherein the metal shield layer, the third insulating layer, and the carbon material layer form an electromagnetic dampening zone in which the carbon material layer enhances the shielding characteristics of the metal shield layer.

6. The noise dampening enclosure material of claim 1, wherein:
the first insulating layer is adjacent to and in contact with the carbon material layer;
the second insulating layer is adjacent to and in contact with the metal shield layer;
the third insulating layer is adjacent to and in contact with the carbon material layer; and
the third insulating layer is adjacent to and in contact with the metal shield layer.

7. The noise dampening enclosure material of claim 1, wherein:
the first insulating layer is an inner insulating layer;
the second insulating layer is an outer insulating layer;
the enclosure material forms an enclosure having a plurality of walls;
each wall includes:
the inner insulating layer disposed inwardly of the enclosure;
the outer insulating layer disposed outwardly of the enclosure;
the carbon material layer adjacent to and in contact with the inner insulating layer; and
the metal shield layer adjacent to and in contact with the outer insulating layer.

8. The noise dampening enclosure material of claim 7, wherein the walls of the enclosure are structured to prevent electromagnetic noise from escaping the enclosure.

9. The noise dampening enclosure material of claim 1, wherein:
the first insulating layer is an inner insulating layer;
the second insulating layer is an outer insulating layer;
the enclosure material forms an enclosure having a plurality of walls;
each wall includes:
the inner insulating layer disposed inwardly of the enclosure;
the outer insulating layer disposed outwardly of the enclosure;
the carbon material layer adjacent to and in contact with the outer insulating layer; and the metal shield layer adjacent to and in contact with the inner insulating layer.

10. The noise dampening enclosure material of claim 9, wherein the walls of the enclosure are structured to prevent electromagnetic noise from entering the enclosure.

11. A noise dampening material, comprising:
a carbon material layer a metal shield layer;
a first insulating layer disposed between the carbon material layer and the metal shield layer; and
a second insulating layer disposed on a surface of the carbon material layer opposite the first insulating layer;
wherein the carbon material layer is composed of a plurality of strands of resin-impregnated carbon fibers such that the carbon material layer is resistive to electromagnetic radiation.

12. The noise dampening material of claim 11, wherein the carbon material layer, the metal shield layer, the first insulating layer, and the second insulating layer form an electromagnetic noise dampening bulkhead disposed between a plurality of circuit boards.

13. The noise dampening material of claim 11, wherein the carbon material layer, the metal shield layer, the first insulating layer, and the second insulating layer form an electromagnetic noise dampening region atop a table.

14. A noise dampening boot, comprising:
an insulating inner section;
a metal shield layer surrounding the insulating inner section;
an insulating layer surrounding the metal shield layer;
a carbon material layer surrounding the insulating layer; and
a protective sheath wrapping the carbon material layer;
wherein the carbon material layer is composed of a plurality of strands of resin-impregnated carbon fibers such that the carbon material layer is resistive to electromagnetic radiation.

15. The noise dampening boot of claim 14, wherein the carbon material layer includes resin-impregnated carbon fiber having a specific resistance no greater than 100 $\Omega/cm^2$.

16. The noise dampening boot of claim 14, wherein the carbon material layer includes fiber strands disposed in parallel relative to an axial direction of the inner section.

17. The noise dampening boot of claim 16, wherein substantially all of the fiber strands of the carbon material layer are disposed in parallel relative to the axial direction of the inner section.

18. The noise dampening boot of claim 14, wherein the inner section includes an opening therein, and wherein the boot is disposed on the end of a conductor through the opening.

* * * * *